US007101190B2

(12) United States Patent
Spitler et al.

(10) Patent No.: US 7,101,190 B2
(45) Date of Patent: Sep. 5, 2006

(54) ELECTRICAL CONNECTOR AND SYSTEM HAVING CONTACT ARRAY INTERFACE FOR ENGAGING CONTACTS AT VARYING CENTERLINE SPACING

(75) Inventors: Alexandra Lynne Matthews Spitler, Palmyra, PA (US); Michael Fredrick Laub, Harrisburg, PA (US); Charles Dudley Copper, Harrisburg, PA (US); Charles Randall Malstrom, Lebanon, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/989,133

(22) Filed: Nov. 15, 2004

(65) Prior Publication Data

US 2006/0105593 A1   May 18, 2006

(51) Int. Cl.
*H01R 12/00* (2006.01)

(52) U.S. Cl. .............................. 439/65; 429/12; 429/34; 439/61

(58) Field of Classification Search ................. 439/61, 439/62, 65; 429/12, 34
See application file for complete search history.

(56) References Cited

U.S. PATENT DOCUMENTS

| 6,410,176 B1* | 6/2002 | Genc et al. ................... 429/13 |
| 6,464,521 B1 | 10/2002 | Kurotori et al. ............ 439/260 |
| 2003/0215678 A1 | 11/2003 | Barton et al. ................. 429/12 |
| 2005/0074655 A1* | 4/2005 | Ariyoshi et al. .............. 429/34 |

FOREIGN PATENT DOCUMENTS

| EP | 1 001 666 | 5/2000 |
| EP | 1 109 258 | 6/2001 |

* cited by examiner

*Primary Examiner*—Tho D. Ta

(57) ABSTRACT

An electrical connector for mating with a plurality of contacts separated from one another by a nominal pitch value includes an array of contact surfaces having a first dimension measured in a direction perpendicular to a mating direction between the plurality of contacts and the array of contact surfaces. The first dimension is greater than the nominal pitch value, thereby assuring electrical contact between the contacts and the contact surfaces despite an actual deviation from the nominal pitch.

17 Claims, 9 Drawing Sheets

ELECTRICAL CONNECTOR AND SYSTEM HAVING CONTACT ARRAY INTERFACE FOR ENGAGING CONTACTS AT VARYING CENTERLINE SPACING

BACKGROUND OF THE INVENTION

This invention relates generally to electrical connectors, and more specifically, to electrical connectors which mate with contacts having varying centerline spacing due to design variations.

Certain electrical systems, such as, for example, cable to memory board interconnection systems, board to board interconnections, and back-plane connection systems include a large number of interface contacts arranged in line with one another. The interface contacts are designed to be positioned relative to one another with a predetermined centerline spacing between the contacts. The centerline spacing between the interface contacts, however, may vary in actual practice due to manufacturing tolerances in constructing and assembling the system, and over a large number of contacts the accumulation of tolerances is problematic to interfacing the in line contacts with a connector assembly. Specifically, the tolerances may result in misalignment of the in line contacts with corresponding contacts of the connector, which are also aligned with one another on a predetermined centerline spacing. Such misalignment of the interface contacts may result in one or more of the in line contacts touching the same contact in the connector, thereby shorting the interface contacts to one another. Misalignment of the interface contacts may also result in some of the contacts not making electrical connection with any of the contacts of the connector.

Such problems may be particularly acute in applications having stacked components and a large number of corresponding contacts to mate with a connector. Such constructions are employed in existing and emerging technologies, and are introducing new demands on electrical connectors. For example, fuel cell technology utilizes a large number of conductive plates arranged in a stack, and it is desirable to monitor a voltage on the plates during operation. Thus, an electrical contact is provided for each plate, and the contacts are interfaced with a circuit board which processes the voltage on the plates in the stack for monitoring purposes. The contacts are fixed to each plate along an end edge thereof, but the width of the plates in the stack is subject to manufacturing tolerances which may accumulate over a large number of the plates in the stack. Due to the accumulation of tolerances, the actual centerline spacing of some of the contacts in the plates of the fuel cell stack may vary by up to 100% or more of the nominal centerline spacing of the plates in the stack. Such variance of the centerline spacing of the contacts in the stack frustrates the use of conventional connectors to connect the contacts of the plates to the circuit board. The varying contact centerlines will either prohibit mating of the connector to the plate contacts entirely, or cause shorting of the contacts and/or open circuits between the connector and the contacts of the stack.

Conventionally, such tolerance issues have been addressed with tighter control of the manufacturing tolerances. However, reducing the tolerances can become cost prohibitive in certain applications.

BRIEF DESCRIPTION OF THE INVENTION

In accordance with an exemplary embodiment, an electrical connector for mating with a plurality of contacts separated from one another by a nominal pitch value is provided. The connector comprises an array of contact surfaces having a first dimension measured in a direction perpendicular to a mating direction between the plurality of contacts and the array of contact surfaces. The first dimension is greater than the nominal pitch value, thereby assuring electrical contact between the contacts and the contact surfaces despite an actual deviation from the nominal pitch.

Optionally, each of the contact surfaces are arranged upon a circuit board card edge, and the first dimension is approximately twice the nominal pitch value. The circuit board may include opposite first and second engagement surfaces with each of the engagement surfaces comprising a plurality of contact pads. The contact pads of the first engagement surface may be spaced from one another by a distance greater than the pitch value, and the contact pads of the second engagement surface may be spaced from one another by a distance less than the pitch value. Alternatively, the connector may comprise a housing and blade contacts extending from the housing in a two dimensional array.

According to another exemplary embodiment, an electrical system is provided. The system comprises a plurality of electrical components arranged in line with one another and spaced from one another by a nominal pitch value, and the components have an edge configured to receive an electrical contact in more than one position on each component. A plurality of contacts are selectively engaged to the components, and a connector comprising a plurality of contact surfaces is provided. Each of the contact surfaces is configured to establish an electrical connection with one of the contacts without shorting the contacts due to manufacturing tolerances or design variations of the components whereby an actual spacing of the components deviates from the nominal pitch value.

According to still another exemplary embodiment, an electrical system comprises a fuel cell stack comprising a plurality of conductive plates arranged in line with one another and spaced from one another by a nominal pitch value. Each of the plates have an edge configured to receive an electrical contact in at least one position on each plate, and the edges define a two dimensional array of contact positions. A plurality of contacts are provided, and the contacts selectively populate the two dimensional array of contact positions. A connector comprises a plurality of contact surfaces, and each of the contact surfaces is configured to establish an electrical connection with one of the contacts without shorting the contacts due to manufacturing tolerances or design variations of the components whereby an actual spacing of the components deviates from the nominal pitch value.

DETAILED DESCRIPTION OF THE INVENTION

Figure 1:
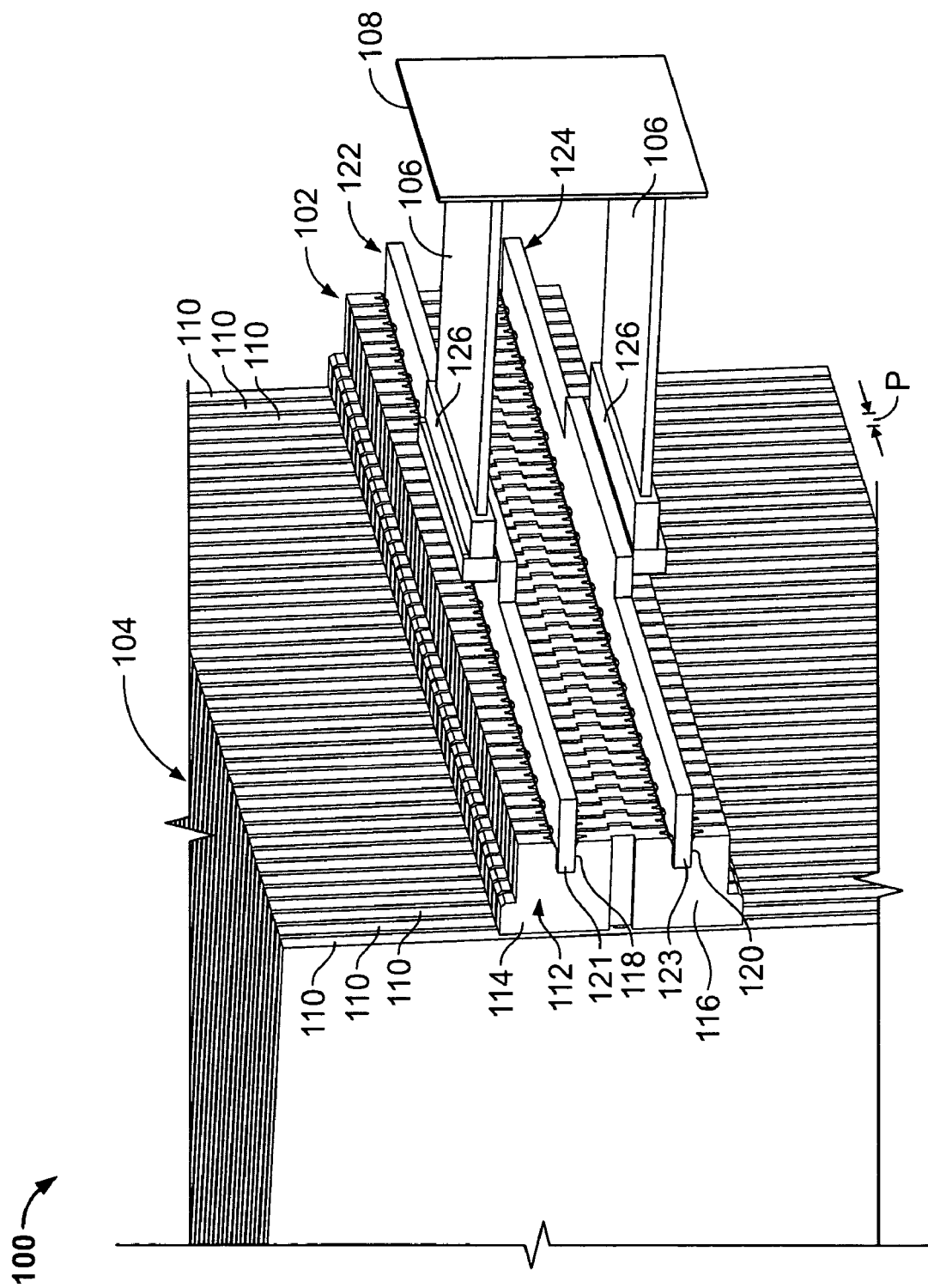
FIG. 1 is a partial perspective view of an exemplary electrical system including a connector formed in accordance with an exemplary embodiment of the present invention.
Figure 2:
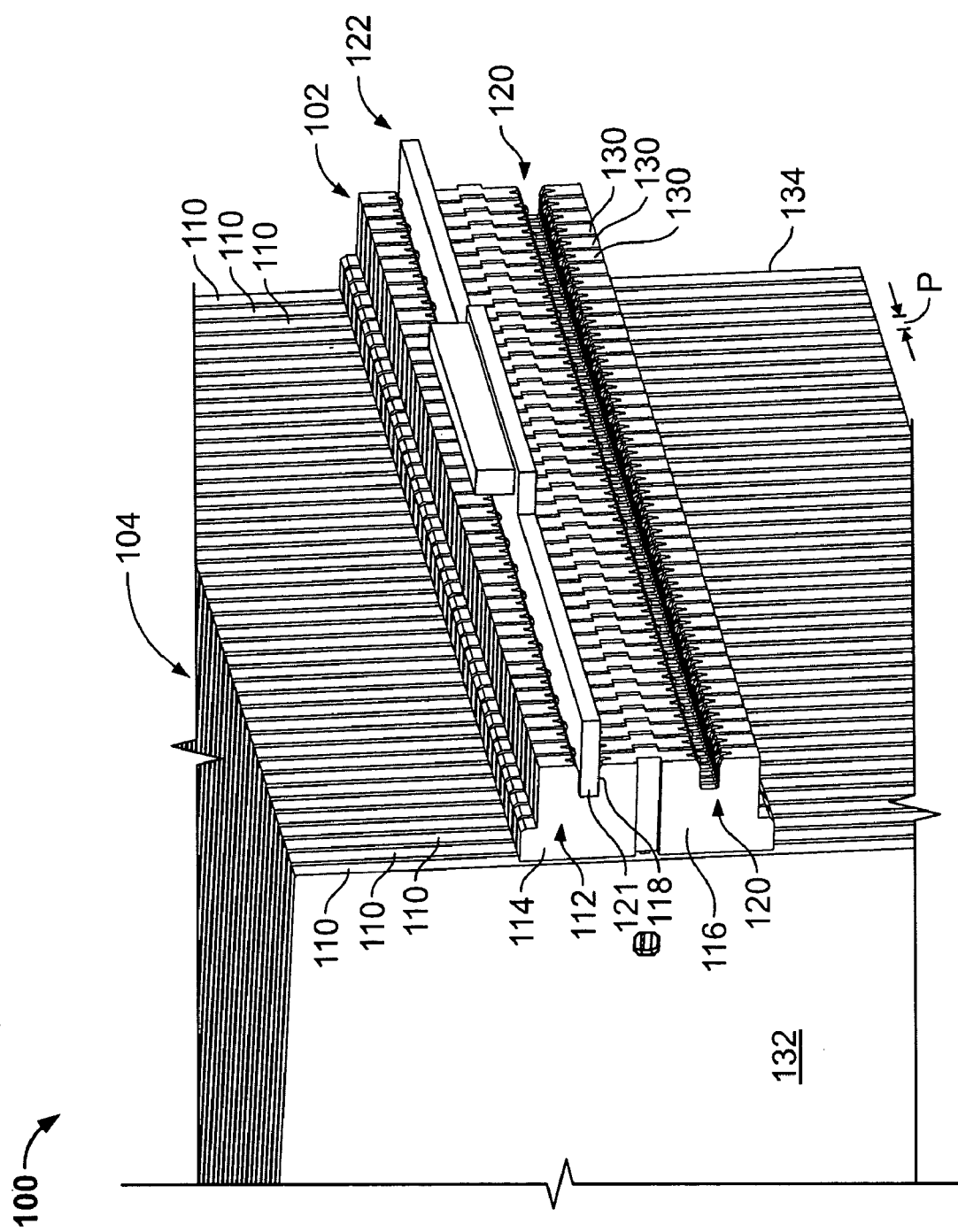
FIG. 2 is another partial perspective view of the system shown in FIG. 1.

FIGS. 1 and 2 are partial perspective views of an exemplary electrical system 100 including an exemplary connector assembly 102 which is adapted for engaging contacts on varying centerlines as explained below.

In an exemplary embodiment, the connector assembly 102 interfaces a fuel cell stack 104 with a monitoring device (not shown) via interface links 106 such as wiring harnesses. The interface links 106 are connected, in turn, to a monitoring module 108 which processes signals transmitted from the fuel cell 104 through the connector assembly 102 and the interface links 106. Thus, the monitoring module 108 may be used to monitor the operation of the fuel cell stack 104 for testing and/or diagnostic purposes. While the connector assembly 102 is illustrated in the context of interfacing a fuel cell 104 with a monitoring module 108, it is contemplated that the benefits of the invention accrue to other applications of the assembly 102, and the fuel cell 104 is but one exemplary apparatus which presents issues with respect to contact centerline spacing which the connector assembly 102 overcomes. Consequently, the description set forth herein is for illustrative purposes only and is not intended to limit the invention to any particular end use or application.

The fuel cell stack 104 is a known unit which reacts a gaseous fuel, such as reformed natural gas, with air to produce electrical power in a known manner. The fuel cell stack 104 includes a number of conductive plates 110 which are arranged in a stack. As explained below, plate contacts (not shown in FIG. 1) are selectively attached to some or all of the plates 110, and the plate contacts permit the monitoring module 108, via the connector assembly 102, to monitor a voltage on corresponding plates 110 of the fuel cell 104 during operation. Each plate 110 in the fuel cell has a predetermined nominal thickness, and the plates 110 are arranged in the stack with a predetermined nominal spacing value between the plates 110, the sum of which is sometimes referred to as a nominal pitch value P for the plates 110. That is, the stack of plates 10 is designed to have a reoccurring dimension P measured in a direction perpendicular to the plane of the plates 110 from an edge of one plate across the thickness of the plate to the edge of an adjacent plate. In theory, according to design parameters, the plates 110 are repeated at a uniform distance P in the fuel cell stack.

In reality, each of the plate thicknesses and the spacing of the plates is subject to manufacturing tolerances, and an actual dimension P may deviate somewhat from the nominal value of the plate thickness and the nominal spacing value for any two adjacent plates in the fuel cell 104. Over a large number of plates 110 in the fuel cell stack, the variance of dimension P across the plates may accumulate and produce a significant variance between the theoretical position of a given plate 110 in the stack and its actual position in the stack. In a stack having a large number of plates 110 (e.g., 50 plates), the variance may be up to 100% or more of the nominal value P. As an example, considering a number of plates n numbered 1 through n, the nth plate in the stack would theoretically be positioned at a distance n*P from the first plate in the stack, but in actual practice, and because of accumulation of manufacturing tolerances, the nth plate may be found at a distance in the range of (n*P+P) to (n*P−P) from the first plate in the stack. Such variability in the position of the plates 110 in the stack produces variability in the contacts connected to the plates 110. Unlike known connectors, however, the connector assembly 102 is fully capable of accommodating such variance in position of the contacts, as explained in detail below.

In an exemplary embodiment, the connector assembly 102 includes an insulative (i.e., nonconductive) housing 112 covering the plate contacts. The housing 112 includes an upper portion 114 and a lower portion 116 each defining a slot 118 and 120, respectively. The slots 118 and 120 receive a forward edge 121, 123 of respective circuit boards 122 and 124, sometimes referred to as pitch spreading boards. Connectors 126 are mounted to the boards 122 and 124 and interface the boards 122 and 124 with the interface links 106.

FIG. 2 illustrates the system 100 with the interface links 106 and the lower board 124 removed. The housing 112 of the connector assembly 102 includes a number of individual housings 130 collectively forming the slots 118 and 120 which extend between opposite sides 132, 134 of the fuel cell stack. The housings 130 are separately attached to each of the plates 110 in the stack, and thus the position of the housings 130 in the stack may vary from the nominal spacing value or pitch P as described above. Each housing 130 includes an upper portion 114 and a lower portion 116, and one of the upper and lower portions 114 and 116 includes a contact extending from a plate 110. The boards 122 and 124 (FIG. 1) are insertable into and removable from the slots 118 and 120 to establish a card edge connection with the plate contacts in the housings 130, and ultimately to electrically connect the monitoring module 108 to the stack of plates 110. Quick connection and disconnection of the plate contacts is therefore provided, and the connector assembly 102 accommodates variances in positioning of the contacts due to the accumulation of manufacturing tolerances in fabricating and spacing the plates 110.

Figure 3:
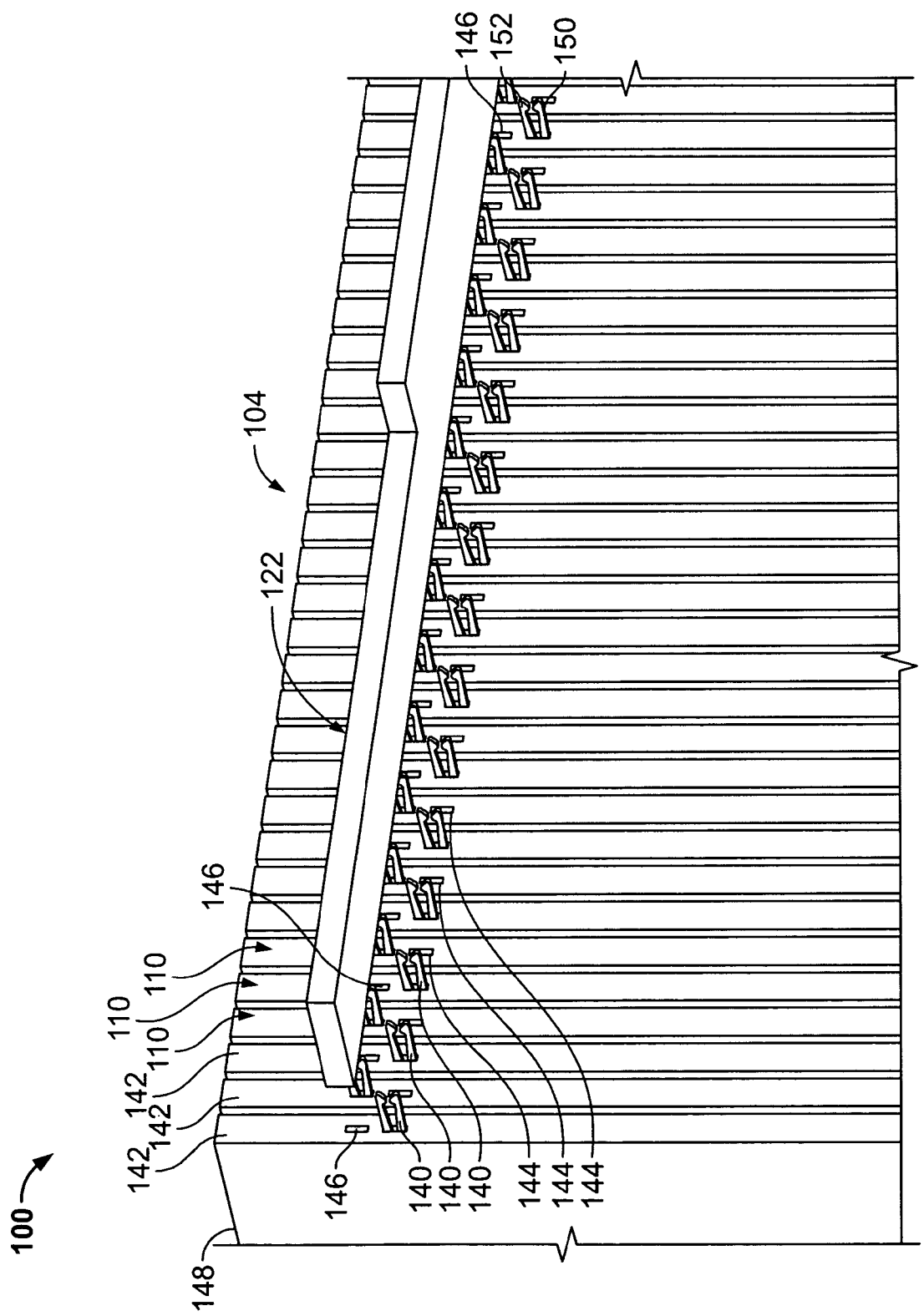
FIG. 3 is a partial perspective assembly view of a portion of the system shown in FIGS. 1 and 2.

FIG. 3 illustrates the plates 110 of the fuel cell 104 with the housing 112 (FIG. 1) removed and the plate contacts 140 extending from end edges 142 of the plates 110. In an exemplary embodiment the plates 110 are fabricated in a known molding process to include cavities 144 and 146 in the end edges 142 wherein and the cavities 144 and 146 are substantially centered in the thickness of the plates 110, although it is recognized that in alternative embodiments the cavities 144, 146 may otherwise be formed and located in a non-centered position in the plates 110. The cavities 146 are substantially aligned in a row at a first distance from a top edge 148 of the plates 110, and the cavities 144 are substantially aligned in a row at a second distance from the top edge 148. Thus, the cavities 144 and 146 extend in first and second rows on the end edges 142 of the plates 110 and define a two dimensional array of cavities 144, 146. Each plate 110 includes a cavity 144 and a cavity 146, and the cavities 144 and 146 are similarly shaped and dimensioned so as to receive a plate contact 140. The plate contacts 140 are therefore positionable in two locations on each end edge 142, namely in the first cavity 144 or the second cavity 146. While two rows of cavities 144, 146 are illustrated, it is understood that more rows of cavities may be provided in an alternative embodiment.

As illustrated in FIG. 3, the plate contacts 140 are selectively populated in the two dimensional array of cavities 144 and 146. That is, not all of the cavities 144, 146 includes a plate contact 140. In one embodiment, and as shown in FIG. 3, the plate contacts 140 are located in one or the other of the cavities 144 and 146 in each plate, but not both. Further, the plate contacts 140 are located in the cavities 144 in every other plate 110 in the stack, with plate contacts 140 located in the cavities 146 of the plates therebetween. That is, the plates 110 of the stack include an alternative sequence of plates 110 with plate contacts 140 in the cavities 144 and plates 110 with plate contacts 140 in the cavities 146. By way of example, considering an n number of plates numbered 1 through n in the stack, the even numbered plates would include plate contacts 140 in the cavities 144, and the odd numbered plates would include plate contacts 140 in the cavities 146, or vice versa. Resultantly, the plate contacts 140 are located diagonally from one another on adjacent plates 110 in the two dimensional array and the plate contacts 140 are staggered from one another in a zigzag pattern across the end edges 142 of the plates 110. The alternating sequence of plate contacts 140 at different elevations in a two dimensional array facilitates accommodation of accumulated tolerances in a position of the plate contacts 140.

While in the illustrated embodiment a plate contact 140 is provided on every plate 110 in the fuel cell stack, and hence every plate 110 may be monitored with the monitoring module (FIG. 1), it is understood that fewer plate contacts 140 may be provided in an alternative embodiment wherein less than all of the plates 110 are to be monitored by the monitoring module 108. Likewise, in such an embodiment having fewer plate contacts 140, the number of housings 130 (FIG. 2) which protect the contacts may be accordingly reduced.

In an exemplary embodiment the plate contacts 140 each include a base (not shown in FIG. 3) which is insertable into the cavities 144, 146, and first and second arms 150 and 152 extending from the end edge 142 of the plates 110. The arms 150 and 152 are resiliently deflectable when the card edges 121, 123 (FIG. 1) of the boards 122 and 124 are inserted therebetween. Because the cavities 144 and 146 are each in the same location in the dimension of the plate thickness (e.g., centered in the plate thickness in an exemplary embodiment), the centerline spacing of the plate contacts 140 is subject to the variance in the pitch P between adjacent plates 100.

Figure 4:
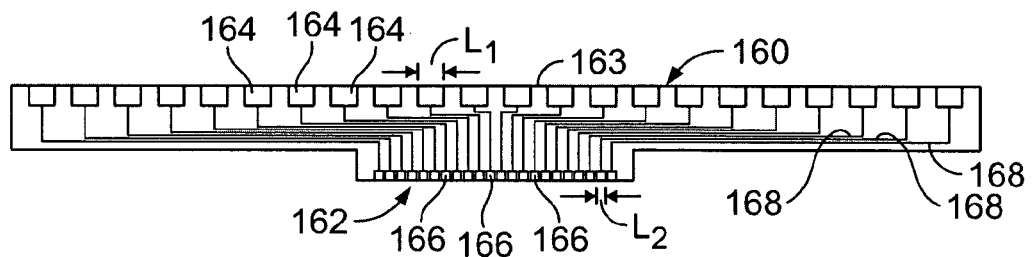
FIG. 4 is a top plan view of the circuit board shown in FIGS. 1–3.

FIG. 4 is a top plan view of an exemplary board 122 including a contact engagement surface 160 and a module engagement surface 162. The contact engagement surface 160 includes a plurality of contact pads 164 aligned along a card edge 163 which is adapted for insertion between the contact arms 150 and 152 (FIG. 3) of the plate contacts 140. The card edge 163 extends for a sufficient length to span a row of plate contacts 140 in the two dimensional array of plate contacts 140 in the stack of plates 110, and each of the contact pads 164 extends for a dimension $L_1$ (measured in a direction perpendicular to a mating direction between the plate contacts 140 and the contact pads 164) along the edge 163 which is greater than the nominal pitch value P (FIGS. 1 and 2) of the stack of plates 110. In an exemplary embodiment, $L_1$ is approximately twice the value of P, and therefore when the forward edge 121 (FIG. 2) is received in the slot 118 of the housings 130 (FIG. 2) a selected one of the plate contacts 140 (FIG. 3) may vary from its theoretical position based upon the nominal value of P by up to 100% and still electrically couple the plate contact with the respective contact pad 164 on the contact engagement surface 160. It is understood that greater or lesser ratios of $L_1$ and P may be employed in other embodiments as desired or as needed to ensure engagement of plate contacts 140 to the contact engagement surface 160.

Additionally, because the plate contacts 140 are staggered diagonally from one another on alternating plates 110, plate contacts 140 in adjacent plates 110 in the stack may not engage the same contact pad 164 on the contact engagement surface 160 of the board 122. Rather, because of the staggered contact in the two dimensional array of plate contacts 140, adjacent plate contacts 140 in the stack engage different circuit boards 122, 124, respectively, and shorting of the plate contacts 140 on the contact engagement surfaces 160 of the boards is avoided even when the plate contacts 140 are much closer to one another in the stack than the theoretical pitch value P.

The module engagement surface 162 includes a number of contact pads 166 which are smaller than the contact pads 164 of the contact engagement surface 160, and the contact pads 166 have a dimension $L_2$ (measured in a direction perpendicular to a mating direction between the plate contacts 140 and the contact pads 164) which is less than $L_1$. Thus, while $L_1$ is greater than the value of P, $L_2$ is less than the value of P. Accordingly, the module engagement surface 162 is more compact than the contact engagement surface 160 and extends for a lesser axial length of the board 122 than the contact engagement surface 160. Conductive traces 168 interconnect each respective contact pad 164 on the contact engagement surface 160 to a contact pad 166 on the module engagement surface 162. The smaller module engagement surface 162 is configured for connection to a wiring harness or standard connector to link the board 122 to the monitoring module 108 (FIG. 1). The board 122 may be fabricated from known circuit board materials, and the contact pads 164, 168 and the conductive traces 168 may be formed according to known methods and techniques.

A connector 126 (FIG. 1) may be provided and mounted on the contact pads 166, and the connector may include a receptacle for receiving an interface link 106 such as a wire harness. Alternatively, a card edge connector could be employed on the module engagement surface to couple the board 122 to an interface link 106.

The board 124 (FIG. 1) is constructed similarly to the board 122, and the contact pads of the board 124 are positioned to engage the plate contacts 140 in the slot 120 (FIGS. 1 and 2) of the housings 130. Each of the boards 122 and 124 includes contact engagement surfaces having contact pads numbering one half of the number of plates 110 in the fuel cell stack, and the respective boards 122, 124 engage the respective rows of the staggered plate contacts 140 via the card edge slots 118 and 120. The board 122 engages the plate contacts 140 in the upper cavities 146 of the plates 110, and the board 124 engages the plate contacts 140 in the lower cavities 144 of the plates 110. The boards 122 and 124 may be used separately or in combination to monitor some or all of the plates 110 with the monitoring module 108. It is understood that additional boards could be employed with more rows of cavities so that each board monitors one third, one fourth, etc. of the plates 110 in the stack. By monitoring a predetermined fraction of the plates 110, the performance of the fuel cell stack may be monitored to varying degrees.

A connector assembly 102 is therefore provided which capably accommodates varying centerline spacing of plate contacts 140 while assuring that all contacts are engaged without shorting any of the plate contacts 140. Additionally, the connector assembly 102 is flexible for use with different types of components. For example, different boards 122 and 124 may be provided having appropriately arranged contact engagement surfaces for devices (e.g., fuel cells) having different nominal pitch values P for the plates 110. The module engagement surface of the boards 122 and 124 may be standardized for universal use among different types of devices.

Figure 5:
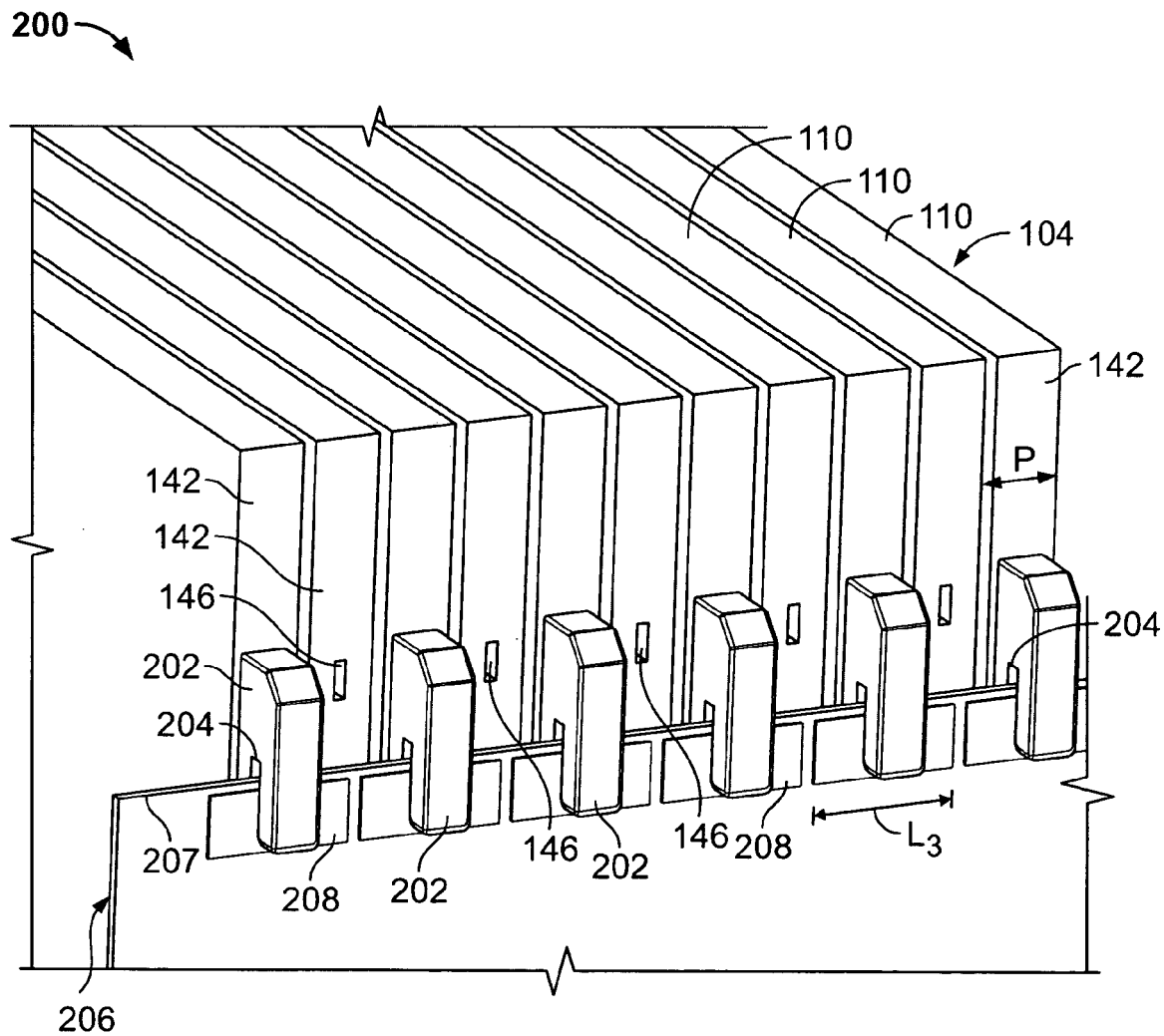
FIG. 5 illustrates an alternative embodiment of an electrical system having a connector assembly formed in accordance with an exemplary embodiment of the present invention.

FIG. 5 illustrates an alternative embodiment of an electrical system 200 including, for example, a fuel cell 104 which is subject to a varying centerline pitch P between the plates 110. End edges 142 of the plates 110 include cavities 146, and right angle contacts (not shown in FIG. 5) that are selectively mounted within and extend from the cavities 146 to selectively populate the cavities. The plate contacts are situated within housings 202 defining a slot 204 therein, and a circuit board 206 is received within the slots 204.

The board 206 includes contact pads 208 aligned along a card edge 207 and having a dimension $L_3$ (measured in a direction perpendicular to a mating direction between the plate contacts and the contact pads 208) which is greater than P. The relative dimension of the contact pads 208 and the nominal pitch value assures that each of the contact pads 208 is engaged to one of the plate contacts, despite accumulation of tolerance in fabricating and spacing the plates 110. The board 206 may be fabricated from known circuit board materials with the contact pads 208 formed thereon according to known methods and techniques.

To avoid shorting of the contacts, and as illustrated in FIG. 5, only every other plate 110 (e.g., the odd numbered plates) in the fuel cell stack is provided with a contact. Thus, the board 206 is suited for engaging contacts in some, but not all of the plates 110. Contacts (not shown in FIG. 5) may be provided on the even numbered plates in a different location from the odd numbered plates to monitor the even numbered plates. That is, the plates 110 may include additional cavities wherein the contacts may be mounted in more than one position on the plates 110.

Figure 6:
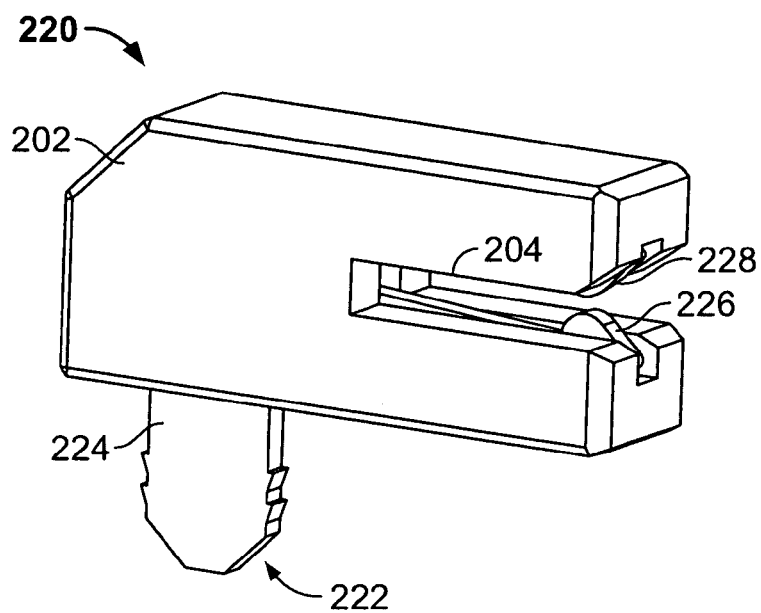
FIG. 6 is a perspective view of a contact assembly for the system shown in FIG. 5.

FIG. 6 is a perspective view of a contact assembly 220 for the system 200 shown in FIG. 5. The assembly 220 includes a conductive contact 222 having a base 224 insertable into a cavity 146 (FIG. 5) of a plate 110, and a first contact arm 226 and a second contact arm 228 extending from the base 224. The arms 226 and 228 are resiliently deflectable when the card edge 207 (FIG. 5) of the board 206 is inserted therebetween. The arms 226 and 228 extend at a right angle from the base 224, and an insulative housing 202 surrounds the contact arms 226 and 228 while defining a slot 204 which receives the board 206. The right angle contacts 222 receive the board 206 in a direction parallel to the end edges 142 of the plates 110, and therefore the system 200 occupies less room than the system 100. Additionally, hold-down hardware (not shown) may be required to securely mount the board 206 to the right angle contacts 222 for monitoring purposes.

The board 206 may include a module engagement surface (not shown) for interfacing with a monitoring module 108 (FIG. 1). Additionally, circuitry for plate testing and/or monitoring could be directly incorporated into the board 206.

A connector assembly is therefore provided which capably accommodates varying centerline spacing of contacts 222 while assuring that all contacts are engaged without shorting any of the contacts 222.

Figure 7:
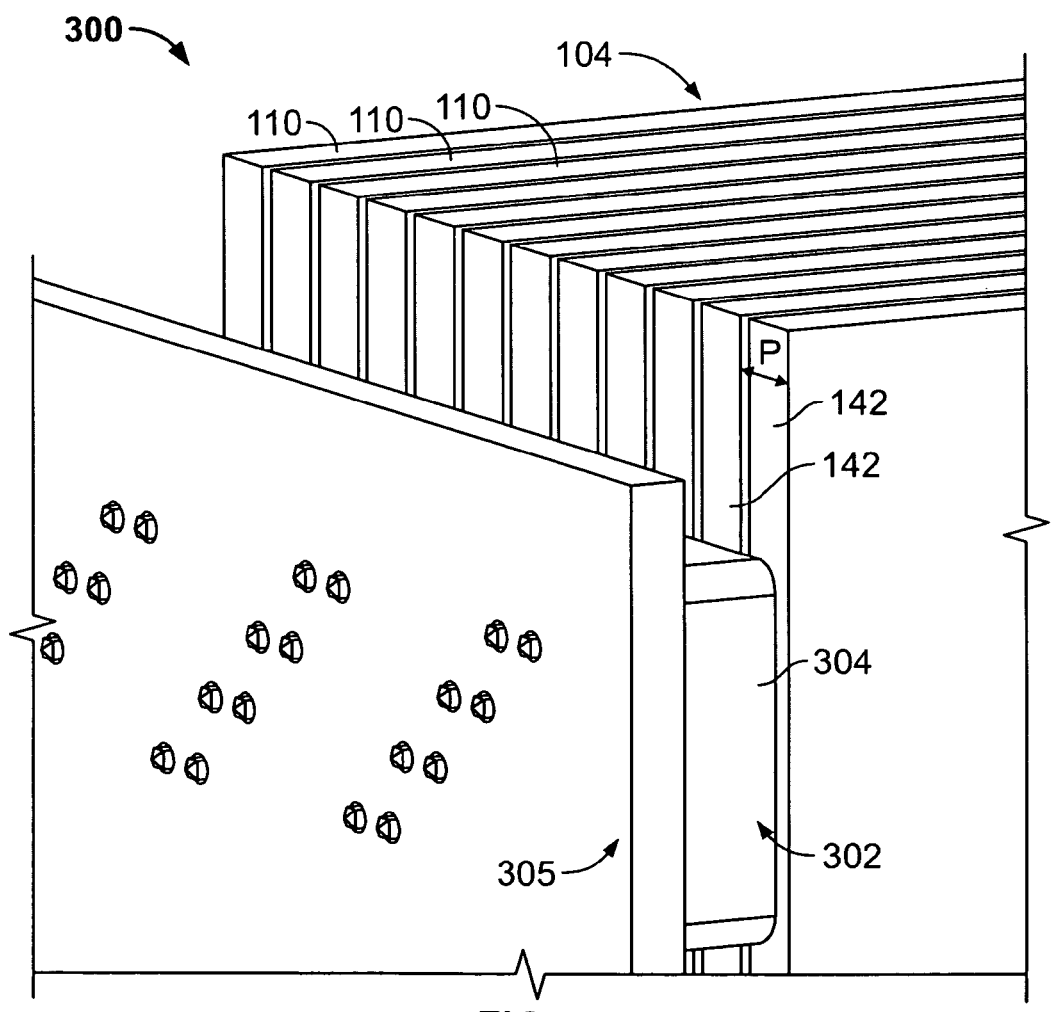
FIG. 7 is a partial perspective view of another exemplary embodiment of an electrical system having a connector assembly formed in accordance with the present invention.

FIG. 7 illustrates another embodiment of an electrical system 300 including, for example, a fuel cell 104 which is subject to a varying centerline pitch P between the plates 110. End edges 142 of the plates 110 include cavities (not shown in FIG. 7), and contacts (not shown in FIG. 7) mounted within and extending from the cavities. A connector 302 includes an insulative housing 304 having contacts (not shown in FIG. 7) mounted thereto which engage the contacts extending from the plates 110. A monitoring module 305 is coupled to the connector for monitoring the plates 110 in the fuel cell stack.

Figure 8:
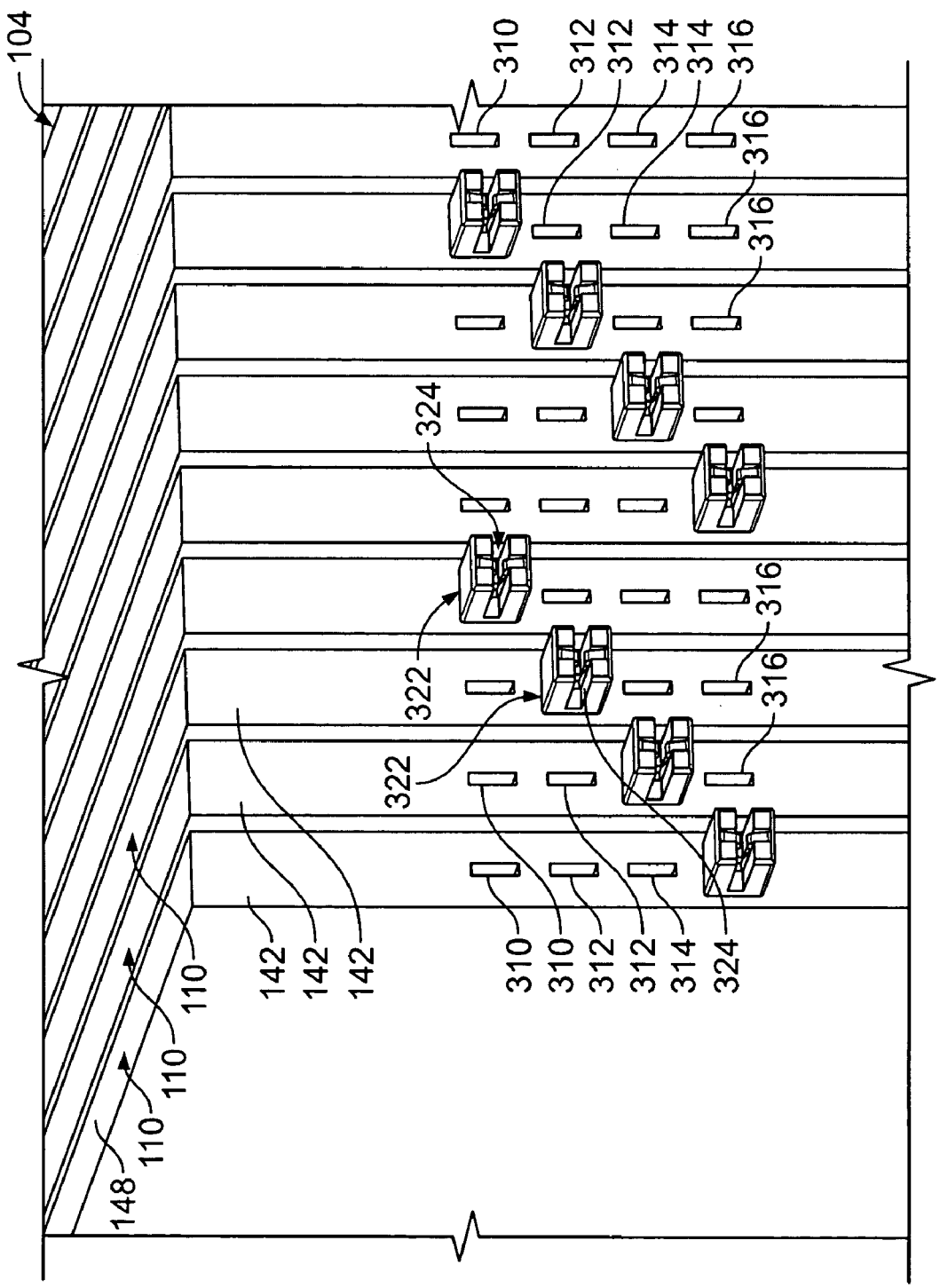
FIG. 8 is a partial perspective view of the system shown in FIG. 8 with the connector removed.
Figure 9:
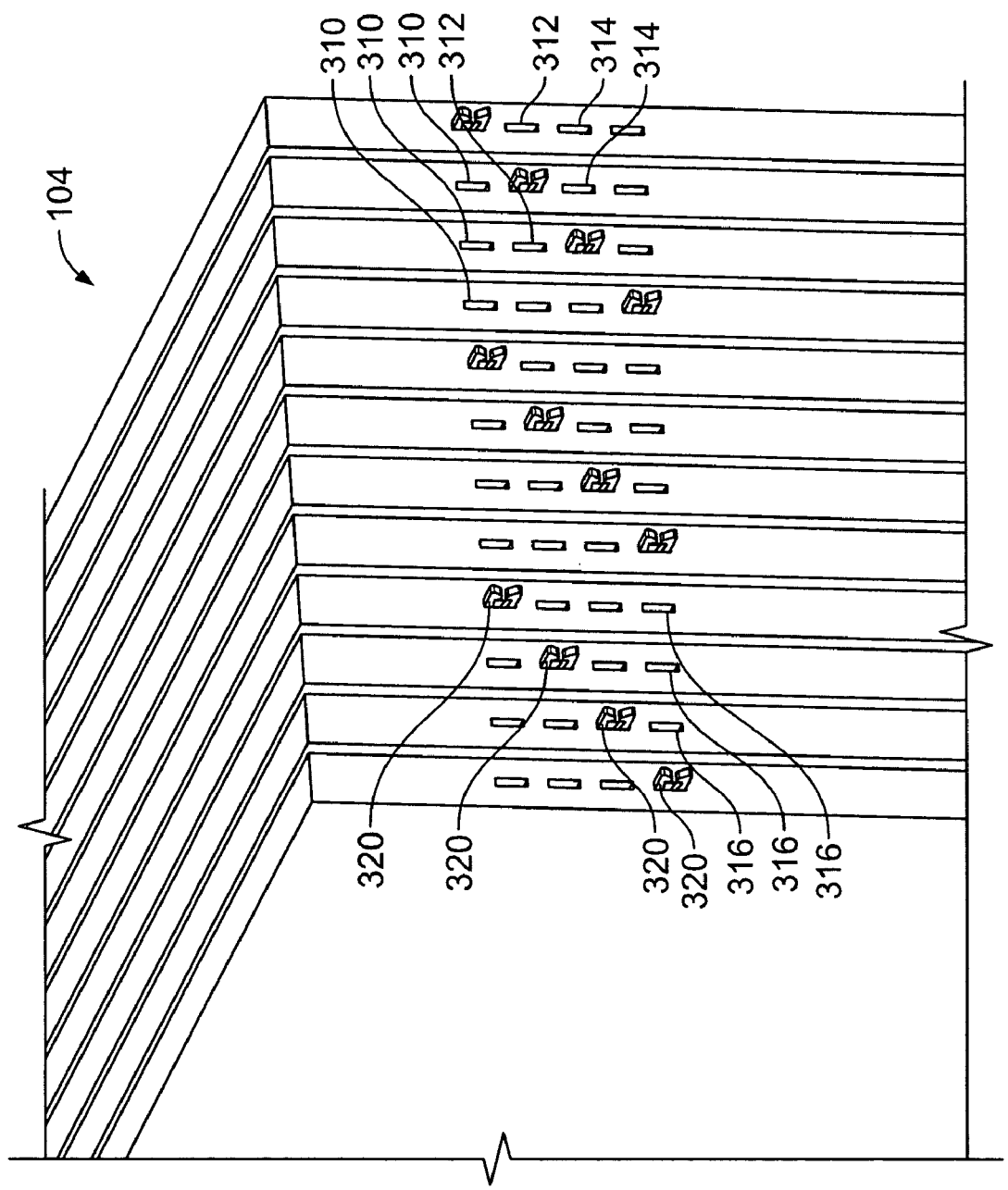
FIG. 9 is a view similar to FIG. 8 but with parts removed.

FIGS. 8 and 9 illustrate multiple contact cavities 310, 312, 314 and 316 formed in each end edge 142 of the plates 110. The cavities 310–316 are arranged in four rows, respectively, and each row of cavities 310, 312, 314 and 316 is located a different distance from the top edge 148 of the plates 110.

Contacts 320 (FIG. 9) are selectively populated in the two dimensional array of cavities 310, 312, 314 and 316. That is, not all of the cavities 310, 312, 314 and 316 includes a contact 320. In one embodiment, and as shown in FIGS. 8 and 9, the contacts 320 are located in only one of the cavities 310, 312, 314 and 316 in each plate. Further, the contacts 320 are located in the respective cavities 310, 312, 314 and 316 in every fourth plate 110 in the stack. That is, the plates 110 of the stack include an alternative sequence of four plates 110 with contacts 320 in the cavity 316 in the first plate, a contact 320 in the cavity 314 in the second plate, a contact 320 in the cavity 312 in the third plate, and a contact 320 in the cavity 310 in the fourth plate. Resultantly, the contacts 320 are located in diagonal lines in each sequence of four plates 110, and the contacts 320 are staggered from one another in adjacent plates 110. The alternating sequence of contacts 320 at different positions or elevations in a two dimensional array facilitates accommodation of accumulated tolerances in a position of the contacts 320. Like the foregoing contacts, the contacts 320 include a base (not shown) insertable into the cavities 310–316 of the plates 110, and a first contact arm and a second contact arm extending from the base. The contact arms are deflectable when a mating contact is inserted therebetween.

Insulative housings 322 (FIG. 8) are fitted over each of the contacts 320 (FIG. 9) on the plates 110, and the housings 322 define an engagement slot 324. The slots 324 of the housings 322 assist in aligning the connector 302 (FIG. 7) as it is mated with the contacts 320 extending from the plates 110.

Figure 10:
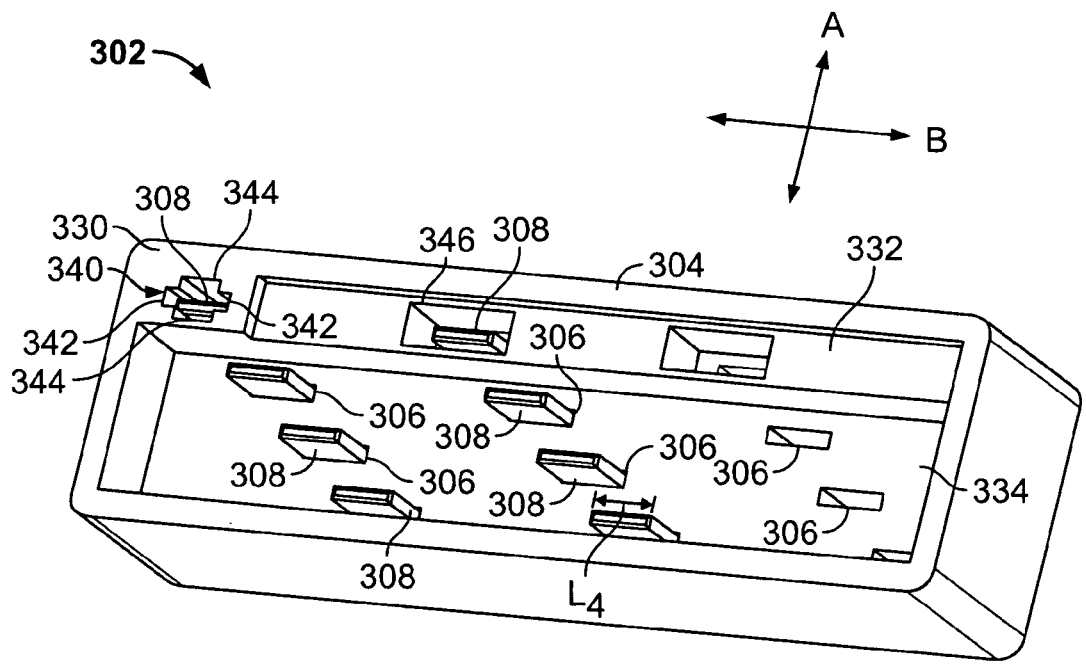
FIG. 10 is a front perspective view of the connector shown in FIG. 7.

FIG. 10 illustrates the connector 302 including the housing 304 defining a plurality of contact apertures 306 and a plurality of blade contacts 308 extending through the contact apertures 306 with some of the blade contacts 308 removed for clarity.

The contact apertures 306 and blade contacts 308 are arranged in diagonal lines of a two dimensional array which align with the diagonal lines of contacts 320 (FIG. 9). Each blade contact 308 aligns with the engagement slot 324 (FIG. 9) of a housing 322, and also aligns with the contact 320 within the housing 322 when the connector 302 is installed. In an exemplary embodiment, the housing 304 is molded from a known insulative material, such as plastic, and includes a primary alignment surface 330 and a secondary alignment surface 332 which is recessed relative to the primary alignment surface 330. A third surface 334 is provided which is recessed relative to the second alignment surface 332. The third surface 334 defines a receptacle surrounding many of the blade contacts 308.

Figure 11:
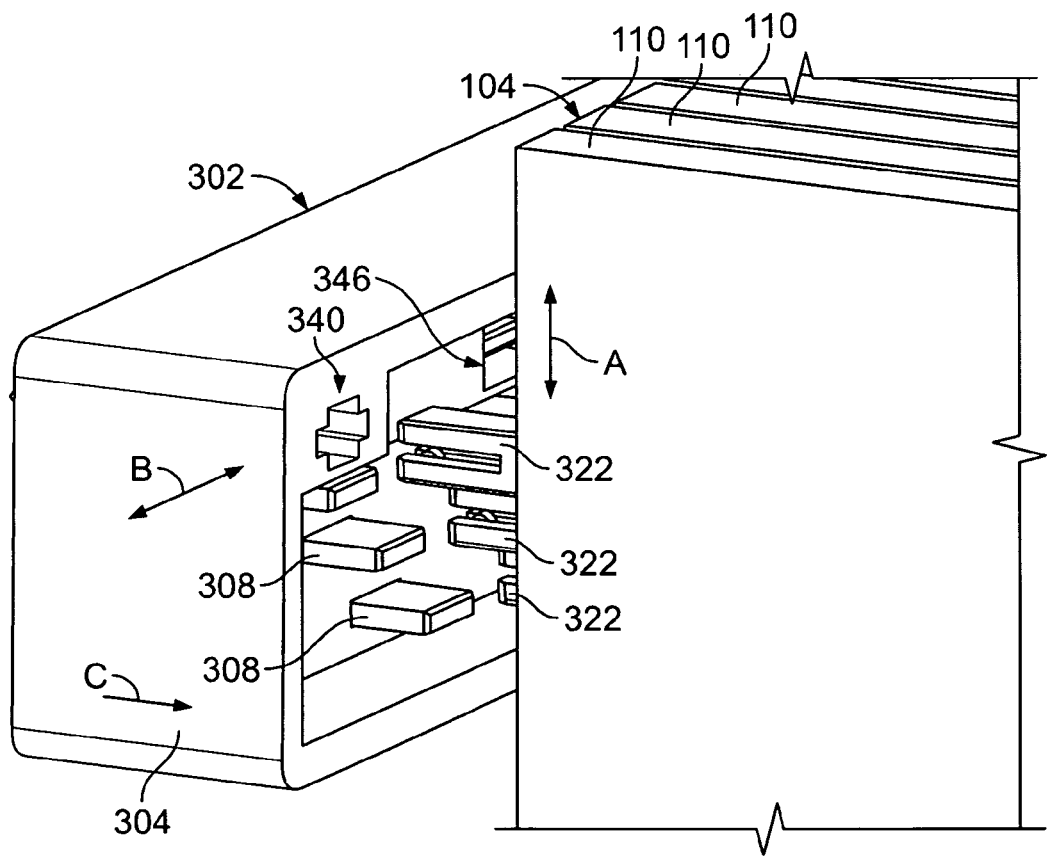
FIG. 11 is a first assembly view of the system shown in FIG. 7.

The primary alignment surface 330 includes a first alignment receptacle 340 having horizontal and vertical alignment grooves 342 and 344 formed in the outer contours thereof. The vertical grooves 344 provide for initial alignment with one of the housings 322 of the contacts 320 in a vertical direction (i.e., in a direction parallel to arrow A), and the horizontal grooves 342 provide for initial alignment in a horizontal direction (i.e., in a direction parallel to arrow B). Thus, the grooves 342 and 344 assist in orienting the connector 302 with respect to the fuel cell stack, as illustrated in FIG. 11.

Figure 12:
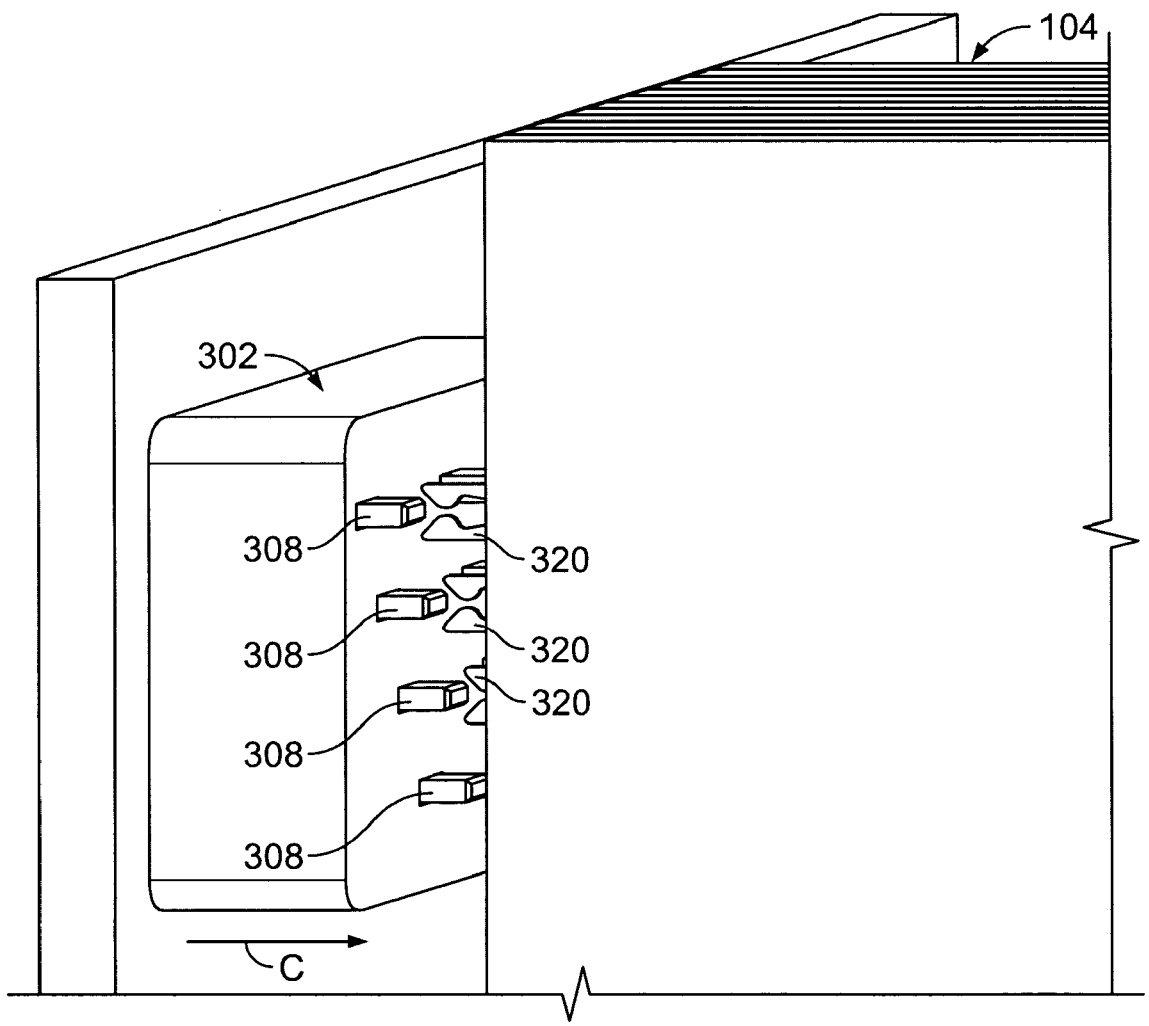
FIG. 12 is a second assembly view of the system shown in FIG. 7.

Additionally, the secondary alignment surface 332 includes a secondary alignment receptacle 346 which provides for secondary alignment with another of the housings 322 and contact 320 of the fuel cell stack. The receptacle 346 may be fitted over another housing 320 to provide further positioning along the vertical axis (i.e., in a direction parallel to arrow A) as illustrated in FIG. 11. Once the alignment receptacles 340 and 346 are aligned with respect to the fuel cell 104, the remaining blade contacts 308, housings 322 and contacts 320 are in alignment as shown in FIGS. 11 and 12, and the connector 302 may be fully mated to the fuel cell 104 by moving the connector in the direction of arrow C. Guidance is therefore provided along two mutually perpendicular axes (i.e., the axes indicated by arrows A and B) to assist in lining up the connector 302 for mating engagement in the direction of Arrow C.

Each contact blade has a dimension $L_4$ (FIG. 10, measured in a direction perpendicular to mating direction between the blades 308 and plate contacts 320) which is greater than the nominal pitch value P (FIG. 7) of the plates 110 in the fuel cell stack. The relative dimensions of the blade contacts 308 and the nominal pitch value assures that an outer surface of each of the blade contacts 308 is engaged to one of the plate contacts 320, despite accumulation of tolerance in fabricating and spacing the plates 110. Additionally, staggering the plate contacts 320 prevents more than one blade contact 308 from engaging the same plate contact 320 and avoids shorting of adjacent contacts.

A connector assembly 300 is therefore provided which capably accommodates varying centerline spacing of contacts 320 while assuring that all contacts are engaged without shorting any of the contacts 320

While the invention has been described in terms of various specific embodiments, those skilled in the art will recognize that the invention can be practiced with modification within the spirit and scope of the claims.

What is claimed is:

1. An electrical system comprising:
    a plurality of electrical components arranged in line with one another and spaced from one another by a nominal pitch value, said components having an edge configured to receive an electrical contact in more than one position on each said component;
    a plurality of contacts selectively engaged to said components; and
    a connector comprising a plurality of contact surfaces, each of said contact surfaces configured to establish an electrical connection with one of said contacts without shorting said contacts due to manufacturing tolerances or design variations of the components whereby an actual spacing of said components deviates from said nominal pitch value, each of said contact surfaces has a dimension measured in a direction perpendicular to a mating direction between the plurality of contacts and the plurality of contact surfaces, said dimension being greater than the nominal pitch value.

2. An electrical system in accordance with claim 1 wherein said plurality of contacts are arranged in a two dimensional array.

3. An electrical system in accordance with claim 1 wherein said contact surfaces have a dimension measured in a direction perpendicular to a mating direction between the plurality of contacts and the plurality of contact surfaces that is approximately twice the nominal pitch value.

4. An electrical system in accordance with claim 1 wherein said connector comprises a second engagement surface opposite said contact surfaces, said second engagement surface comprising a plurality of contact pads, said contact pads of said second engagement surface having a length which is less than the nominal pitch value.

5. An electrical system in accordance with claim 1 wherein said connector comprises a housing and blade contacts extending from said housing.

6. An electrical system in accordance with claim 1 wherein said components comprise conductive plates of a fuel cell stack.

7. An electrical system in accordance with claim 1 wherein said contacts are arranged on a fractional number of said components.

8. An electrical system comprising:
    a plurality of electrical components arranged in line with one another and spaced from one another by a nominal pitch value, said components having an edge configured to receive an electrical contact in more than one position on each said component:
    a plurality of contacts selectively engaged to said components; and
    a connector comprising a plurality of contact surfaces, each of said contact surfaces configured to establish an electrical connection with one of said contacts without shorting said contacts due to manufacturing tolerances or design variations of the components whereby an actual spacing of said components deviates from said nominal pitch value, wherein said connector comprises a circuit board and said contact surfaces of said connector comprises contact pads.

9. An electrical system comprising:
    a plurality of electrical components arranged in line with one another and spaced from one another by a nominal pitch value, said components having an edge configured to receive an electrical contact in more than one position on each said component;
    a plurality of contacts selectively engaged to said components; and
    a connector comprising a plurality of contact surfaces, each of said contact surfaces configured to establish an electrical connection with one of said contacts without shorting said contacts due to manufacturing tolerances or design variations of the components whereby an actual spacing of said components deviates from said nominal pitch value, wherein each said electrical component comprises a plurality of cavities on an edge thereof, said cavities arranged in a two dimensional array.

10. An electrical system comprising:
    a fuel cell stack comprising a plurality of conductive plates arranged in line with one another and spaced from one another by a nominal pitch value, said plates having an edge configured to receive an electrical contact in at least one position on each said plate, said edges defining a two dimensional array of contact positions;

a plurality of contacts, said contacts selectively populating said two dimensional array of contact positions;

a connector comprising a plurality of contact surfaces, each of said contact surfaces configured to establish an electrical connection with one of said contacts without shorting said contacts due to manufacturing tolerances or design variations of the components whereby an actual spacing of said components deviates from said nominal pitch value; and a housing containing each of said contacts, said housing defining a slot configured to receive a circuit board edge.

11. An electrical system in accordance with claim 10 wherein said connector comprises a second engagement surface opposite said contact surfaces, said second engagement surface comprising a plurality of contact pads having a dimension measured perpendicular to a mating direction of the contacts and the contact surfaces, said dimension being less than the nominal pitch value.

12. An electrical system in accordance with claim 10 further comprising a housing and blade contacts extending from said housing.

13. An electrical system in accordance with claim 10 wherein said contacts are card edge contacts.

14. An electrical system in accordance with claim 10 wherein each of said contact surfaces in said array has a dimension measured in a direction perpendicular to a mating direction between the plurality of contacts and the plurality of contact surfaces, said dimension being greater than the nominal pitch value.

15. An electrical system in accordance with claim 14 wherein said dimension is approximately twice the nominal pitch value.

16. An electrical system in accordance with claim 10 wherein said connector is a circuit board and said contact surfaces of said connector comprises contact pads.

17. An electrical system in accordance with claim 16, wherein said contact surfaces are surfaces of a blade contact.

* * * * *